(12) United States Patent
Yamada et al.

(10) Patent No.: US 8,499,430 B2
(45) Date of Patent: Aug. 6, 2013

(54) ASSEMBLY METHOD OF TRANSFER MECHANISM AND TRANSFER CHAMBER

(75) Inventors: Youhei Yamada, Nirasaki (JP); Yoshihiro Kai, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 398 days.

(21) Appl. No.: 12/847,320

(22) Filed: Jul. 30, 2010

(65) Prior Publication Data

US 2011/0027058 A1   Feb. 3, 2011

(30) Foreign Application Priority Data

Jul. 31, 2009   (JP) ................................. 2009-178874

(51) Int. Cl.
| | |
|---|---|
| *B23P 11/00* | (2006.01) |
| *B23P 19/00* | (2006.01) |
| *B66C 13/06* | (2006.01) |
| *B66C 19/00* | (2006.01) |
| *B65G 1/133* | (2006.01) |

(52) U.S. Cl.
USPC .......... 29/428; 414/751.1; 414/589; 414/785; 212/71; 212/175; 212/270; 29/824; 29/823; 29/822

(58) Field of Classification Search
USPC .............. 29/428, 700, 822, 823, 824; 212/71, 212/74, 83, 175, 179, 180, 270; 414/336, 414/561, 589, 591, 749.1, 749.6, 751.1, 785
See application file for complete search history.

(56) References Cited

U.S. PATENT DOCUMENTS

| | | | | | |
|---|---|---|---|---|---|
| 2,349,389 | A | * | 5/1944 | Thompson | .................... 254/285 |
| 4,736,515 | A | * | 4/1988 | Catena | ............................ 29/714 |
| 4,762,239 | A | * | 8/1988 | Wissman et al. | ............. 212/179 |
| 5,088,176 | A | * | 2/1992 | Koga | .............................. 29/430 |
| 5,167,065 | A | * | 12/1992 | Koga | .............................. 29/824 |
| 5,177,862 | A | * | 1/1993 | Speece | ........................... 29/824 |
| 5,351,384 | A | * | 10/1994 | Barnhart et al. | ................ 29/430 |
| 5,406,697 | A | * | 4/1995 | Busisi | ............................. 29/721 |
| 6,539,602 | B1 | * | 4/2003 | Ozawa et al. | ............. 29/402.11 |
| 7,306,423 | B2 | * | 12/2007 | Ogawa et al. | .............. 414/749.1 |
| 7,316,537 | B2 | * | 1/2008 | Park et al. | ................... 414/744.1 |
| 7,478,470 | B2 | * | 1/2009 | Mogck et al. | ................ 29/564.1 |
| 7,562,430 | B2 | * | 7/2009 | Waisanen | ..................... 29/281.5 |
| 7,699,085 | B2 | * | 4/2010 | Chikaki | ........................ 156/382 |
| 8,028,735 | B2 | * | 10/2011 | Chikaki | ........................ 156/382 |
| 8,051,544 | B2 | * | 11/2011 | Graham | ..................... 29/402.08 |
| 8,176,611 | B1 | * | 5/2012 | Waisanen | ..................... 29/281.5 |
| 8,282,333 | B2 | * | 10/2012 | Oda et al. | ......................... 414/591 |
| 2008/0023293 | A1 | | 1/2008 | Uratani et al. | |

(Continued)

FOREIGN PATENT DOCUMENTS

| | | | |
|---|---|---|---|
| JP | 11081680 A | * | 3/1999 |
| JP | 2005-235904 | | 9/2005 |

(Continued)

*Primary Examiner* — Essama Omgba
(74) *Attorney, Agent, or Firm* — Oblon, Spivak, McClelland, Maier & Neustadt, L.L.P.

(57) ABSTRACT

An assembly method is capable of assembling a transfer mechanism which transfers a target and includes a pick unit for holding the target, a slide unit for sliding the pick unit and a drive unit for driving the slide unit. The assembly method includes installing a lifting mechanism for lifting the units at a ceiling portion of a transfer chamber where the transfer mechanism is accommodated; and assembling the units loaded into the transfer chamber inside the transfer chamber by using the lifting mechanism.

9 Claims, 19 Drawing Sheets

| U.S. PATENT DOCUMENTS | | | |
|---|---|---|---|
| 2009/0041569 A1* | 2/2009 | Bellante | 414/591 |
| 2010/0183414 A1* | 7/2010 | Konosu et al. | 414/589 |
| 2010/0319193 A1* | 12/2010 | Ushio et al. | 29/822 |
| 2011/0127229 A1* | 6/2011 | Laliberte et al. | 212/312 |
| 2011/0226018 A1* | 9/2011 | Pigorini | 65/361 |

| FOREIGN PATENT DOCUMENTS | | |
|---|---|---|
| JP | 2008-30151 | 2/2008 |
| JP | 2009-170533 | 7/2009 |
| KR | 10-2008-0011073 | 1/2008 |

* cited by examiner

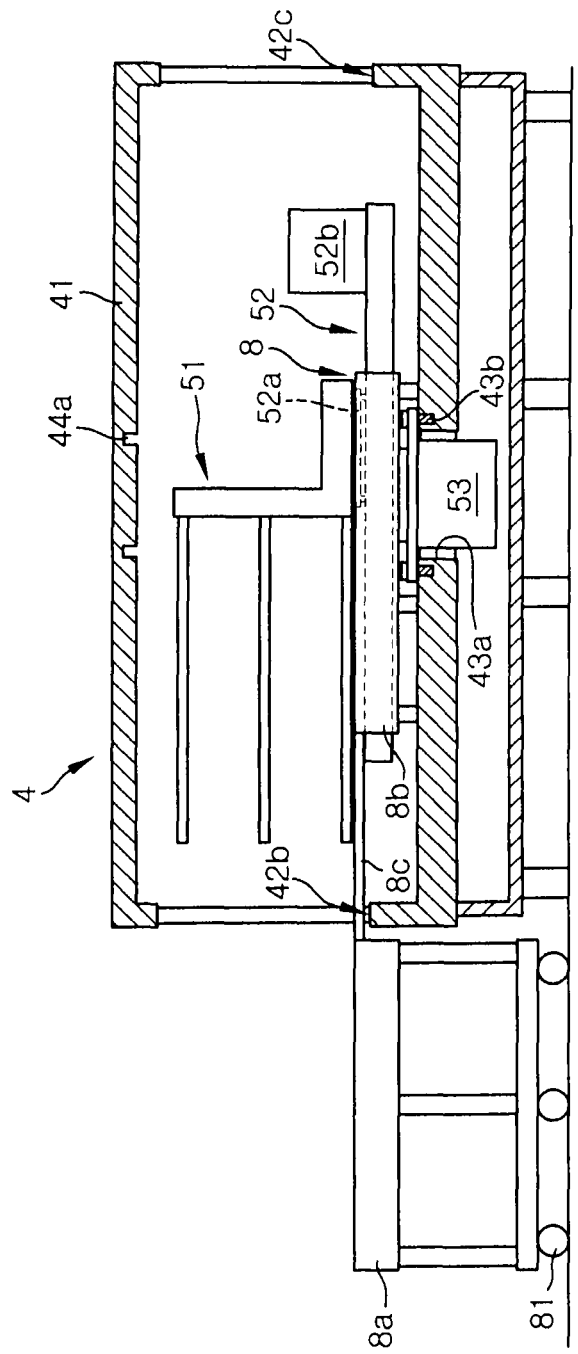

ASSEMBLY METHOD OF TRANSFER MECHANISM AND TRANSFER CHAMBER

CROSS-REFERENCE TO RELATED APPLICATION

This application claims the benefit of priority to Japanese Patent Application No. 2009-178874, filed on Jul. 31, 2009, the entire contents of which are incorporated herein by reference.

FIELD OF THE INVENTION

The present invention relates to an assembly method of a transfer mechanism; and, more particularly, to an assembly method of a transfer mechanism for transferring a large-sized target and a transfer chamber for accommodating the transfer mechanism.

BACKGROUND OF THE INVENTION

Generally, in a factory for manufacturing a large-sized product such as a solar battery module, an FPD or the like, a crane mechanism, e.g., an overhead crane, for moving heavy goods is installed in a clean room (see, e.g., Japanese Patent Application Publication Nos. 2005-235904 and 2005-273945).

A manufacturing system for manufacturing a product is provided in the clean room. The manufacturing system includes: a load-lock chamber for switching a pressure between an atmospheric state and a depressurized state; a processing chamber for performing processes such as etching, film formation or the like on a target, e.g., a glass substrate to be processed in the depressurized state; and a common transfer chamber maintained in the depressurized state and having therein a transfer mechanism for transferring the target between the load-lock chamber and the processing chamber. The transfer mechanism installed in the common transfer chamber is large-sized and heavy-weighted. When the transfer mechanism is installed in the common transfer chamber, the transfer mechanism is divided into units, and the units are loaded into the clean room and then assembled in the clean room. The assembly is performed by using a crane mechanism, e.g., an overhead crane, installed in the clean room.

However, when the crane mechanism is not installed in the clean room, for example, it is difficult to assemble the large-sized and heavy-weighted transfer mechanism.

SUMMARY OF THE INVENTION

In view of the above, the present invention provides an assembly method capable of assembling a transfer mechanism even in a factory where no crane mechanism is installed.

In accordance with a first aspect of the present invention, there is provided an assembly method of a transfer mechanism which transfers a target and includes a pick unit for holding the target, a slide unit for sliding the pick unit and a drive unit for driving the slide unit. The assembly method includes installing a lifting mechanism for lifting the units at a ceiling portion of a transfer chamber where the transfer mechanism is accommodated; and assembling the units loaded into the transfer chamber inside the transfer chamber by using the lifting mechanism.

In accordance with a second aspect of the present invention, there is provided a transfer chamber having therein a transfer mechanism which transfers a target and includes a pick unit for holding the target, a slide unit for sliding the pick unit and a drive unit for driving the slide unit. Further, a detachable lifting mechanism for assembling the units is installed at an installation portion provided in a ceiling portion of the transfer chamber.

In accordance with a third aspect of the present invention, there is provided an assembly method of a transfer mechanism which transfers one or more targets and includes a pick unit for holding the targets, a slide unit for sliding the pick unit and a drive unit for driving the slide unit, the assembly method including installing a lifting mechanism for lifting the units at a ceiling portion of a transfer chamber where the transfer mechanism is accommodated; and inserting a rail member on which a moving carriage moves, from an outside of the transfer chamber into an inside of the transfer chamber.

Further, the assembly method includes mounting the drive unit on the moving carriage; moving the moving carriage on which the drive unit is mounted to a position above a drive unit installation portion in the transfer chamber; lifting the drive unit by using the lifting mechanism and separating the drive unit from the moving carriage; and retreating the moving carriage from the drive unit installation portion, lowering the drive unit to the drive unit installation portion, and installing the drive unit to the drive unit installation portion.

Furthermore, the assembly method includes mounting the slide unit on the moving carriage; moving the moving carriage on which the slide unit is mounted to a position above a slide unit installation portion of the drive unit; lifting the slide unit by using the lifting mechanism and separating the slide unit from the moving carriage; retreating the moving carriage from the slide unit installation portion, lowering the slide unit to the slide unit installation portion, and installing the slide unit at the slide unit installation portion; and removing the lifting mechanism from the ceiling portion of the transfer chamber.

Further, the assembly method includes providing the pick unit with jack bolts for jacking up the pick unit; mounting on the moving carriage the pick unit to which the jack bolts are provided; moving the moving carriage to a position above a slide base provided at the slide unit; jacking up the pick unit by using the jack bolts and separating the pick unit from the moving carriage; retreating the moving carriage from the slide base, lowering the pick unit to the slide base, and installing the pick unit on the slide base; removing the jack bolts from the pick unit; and removing the rail member.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
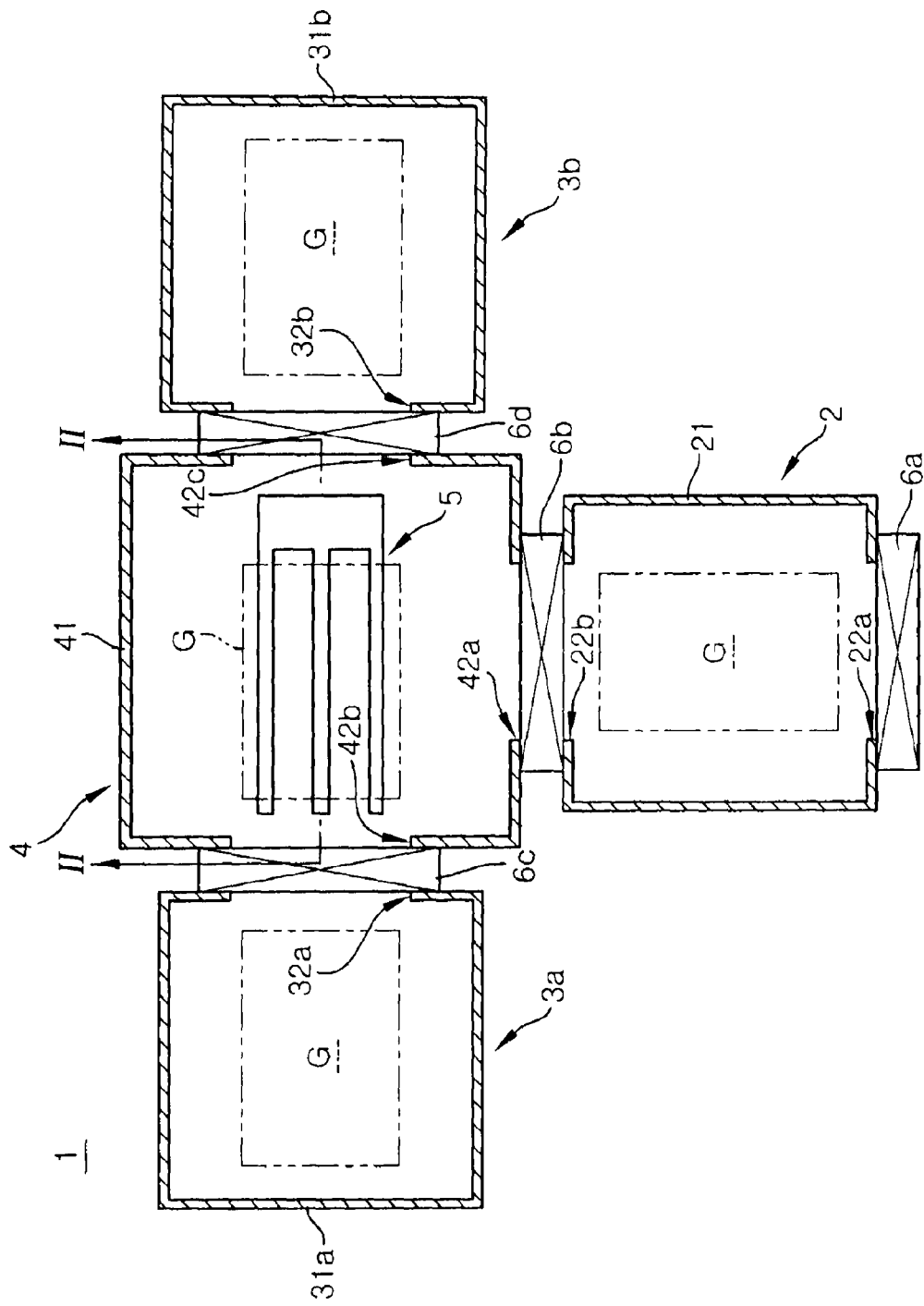
FIG. 1 is a horizontal cross sectional view schematically showing an example of a manufacturing system capable of implementing an assembly method of a transfer mechanism in accordance with an embodiment of the present invention.

The embodiments of the present invention will be described with reference to the accompanying drawings which form a part hereof. Throughout the drawings, like reference numerals will be given to like parts.

Figure 2:
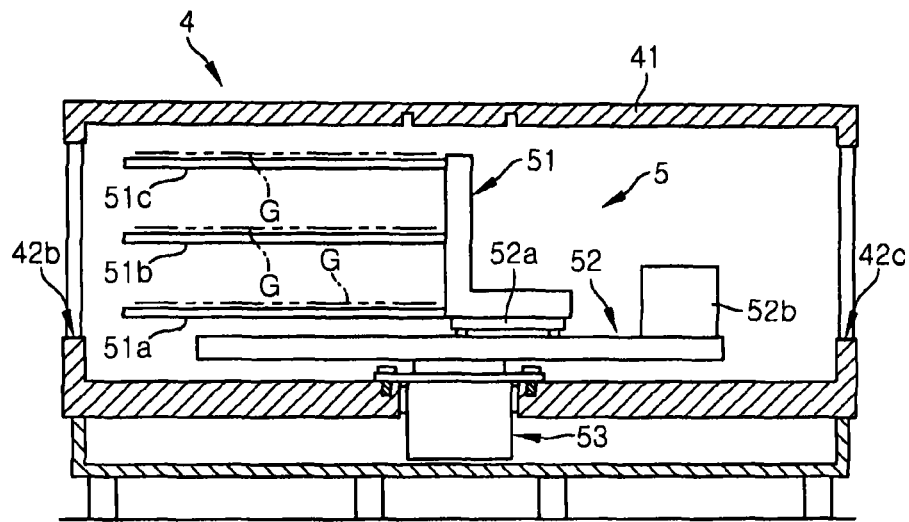
FIG. 2 describes a cross sectional view taken along line II-II of FIG. 1.

FIG. 1 is a horizontal cross sectional view schematically showing an example of a manufacturing system capable of implementing an assembly method of a transfer mechanism in accordance with an embodiment of the present invention; and FIG. 2 describes a cross sectional view taken along line II-II of FIG. 1. A manufacturing system shown in FIGS. 1 and 2 performs etching or film formation on a target, e.g., a glass substrate used for manufacturing a solar battery module or an FPD.

As illustrated in FIG. 1, a manufacturing system 1 in accordance with an embodiment of the present invention includes: a load-lock chamber 2 for switching a pressure between an atmospheric state and a depressurized state; processing chambers 3a and 3b for performing etching, film formation or the like on a target G, e.g., a glass substrate; and a common transfer chamber 4 maintained in a depressurized state during processing and having therein a transfer mechanism 5 for transferring the target G between the load-lock chamber 2 and the processing chambers 3a and 3b.

In this example, the load-lock chamber 2, the processing chambers 3a and 3b and the common transfer chamber 4 are vacuum equipments respectively having airtight vessel main bodies 21, 31a, 31b and 41 in which the target G can be kept under a depressurized state. The vessel main bodies 21, 31a, 31b and 41 have openings 22a, 22b, 32a, 32b, 42a, 42b and 42c for loading and unloading the target G.

The vessel main body 21 of the load-lock chamber 2 communicates with an outside of the manufacturing system 1, i.e., an atmospheric side, via the opening 22a of the vessel main body 21 and a gate valve 6a for opening and closing the opening 22a. The opening 22a is used to load an unprocessed target G and unload a processed target G. A target accommodating container (not shown) for accommodating therein unprocessed targets G and processed targets G is provided at the atmospheric side. Further, the vessel main body 21 communicates with the vessel main body 41 of the common transfer chamber 4 via the opening 22b of the vessel main body 21, a gate valve 6b for opening and closing the opening 22b and the opening 42a of the vessel main body 41.

The vessel main body 31a of the processing chamber 3a communicates with the vessel main body 41 of the common transfer chamber 4 via the opening 32a of the vessel main body 31a, a gate valve 6c for opening and closing the opening 32a and the opening 42b of the vessel main body 41. In the same manner, the vessel main body 31b of the processing chamber 3b communicates with the vessel main body 41 of the common transfer chamber 4 via the opening 32b of the vessel main body 31b, a gate valve 6d for opening and closing the opening 32b and the opening 42c of the vessel main body 41.

In this example, the vessel main body 41 of the common transfer chamber 4 has a rectangular shape, for example, seen from the top. The openings 42a, 42b and 42c are formed at three sides among four sides of the rectangle. A transfer mechanism 5 is provided in the common transfer chamber 4. The transfer mechanism 5 transfers the target G from the load-lock chamber 2 to the processing chamber 3a or 3b, from the processing chamber 3a or 3b to the processing chamber 3b or 3a, and from the processing chamber 3a or 3b to the load-lock chamber 2. To this end, the transfer mechanism 5 can not only vertically move and rotate the target G, but also move into and retreat from the load-lock chamber 2 and the processing chambers 3a and 3b.

Specifically, as shown in FIG. 2, the transfer mechanism 5 includes a pick unit 51 for holding the target G, a slide unit 52 for sliding the pick unit 51 and a drive unit 53 for driving the slide unit 52.

Figure 3:
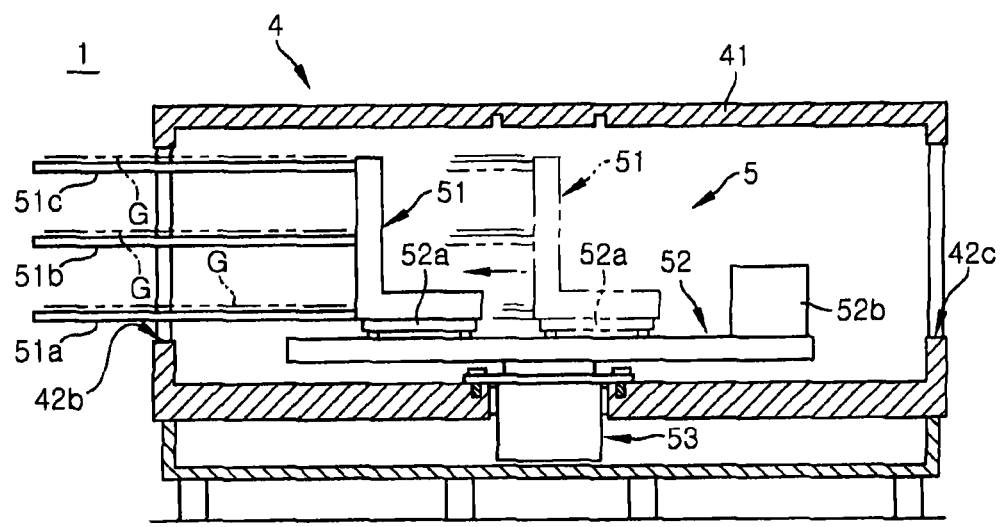
FIG. 3 provides a cross sectional view describing a state where a pick unit is moving into a processing chamber via an opening of a transfer chamber.

A slide base 52a is installed on the slide unit 52, and the pick unit 51 is provided on the slide base 52a. The slide base 52a slides back and forth along a lengthwise direction of the slide unit 52 by a slide base driving unit 52b. Accordingly, the pick unit 51 moves into and retreats from the load-lock chamber 2 and the processing chambers 3a and 3b. FIG. 3 is a cross sectional view showing a state where the pick unit 51 is moving into the processing chamber 3a via the opening 42b, for example. The slide unit 52 can be vertically moved and rotated by the drive unit 53. Hence, the slide unit 52 moves vertically and rotates in the common transfer chamber 4, for example.

The manufacturing system 1 of this embodiment is configured to process at a time a plurality of targets G mounted horizontally and arranged vertically. To this end, the transfer mechanism 5 is also made to transfer a plurality of targets G at a time. In this embodiment, the pick unit 51 has holding members 51a, 51b and 51c arranged in three levels in a height direction thereof and can transfer three targets G at once.

Hereinafter, an example of an assembly method of a transfer mechanism in accordance with an embodiment of the present invention will be described.

Figure 4A:
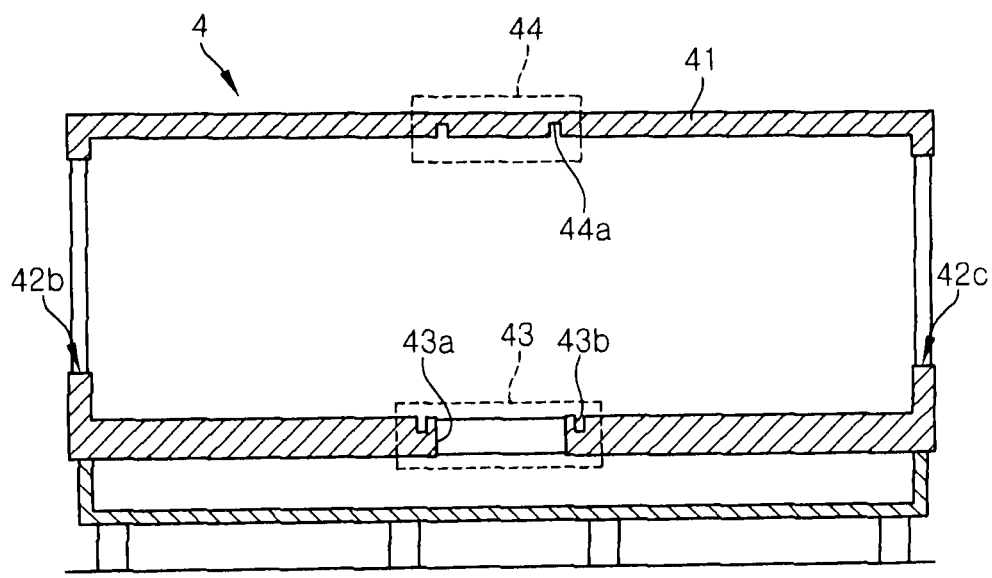
FIG. 4A to 4O present cross sectional views schematically illustrating an example of the assembly method of a transfer mechanism in accordance with the embodiment of the present invention.

FIGS. 4A to 4O are cross sectional views schematically showing the example of the assembly method of the transfer mechanism in accordance with the present embodiment.

FIG. 4A shows a state where the vessel main body 41 of the common transfer chamber 4 is installed in the clean room, for example. The common transfer chamber 4 of this example has a drive unit installation portion 43 at which the drive unit 53 is installed, in a bottom portion of the vessel main body 41, and a lifting mechanism installation portion 44 at which a lifting mechanism is installed, in a ceiling portion of the vessel main body 41. The drive unit installation portion 43 is provided substantially at a center of the bottom portion of the vessel main body 41, and the lifting mechanism installation portion 44 is disposed substantially at a center of the ceiling portion of the vessel main body 41.

Moreover, in this example, the drive unit installation portion 43 has an opening 43a to which the drive unit 53 is inserted and holes 43b formed around the opening 43a to position and fix the drive unit 53. Further, the lifting mechanism installation portion 44 has holes 44a for fixing the lifting mechanism.

Figure 4B:
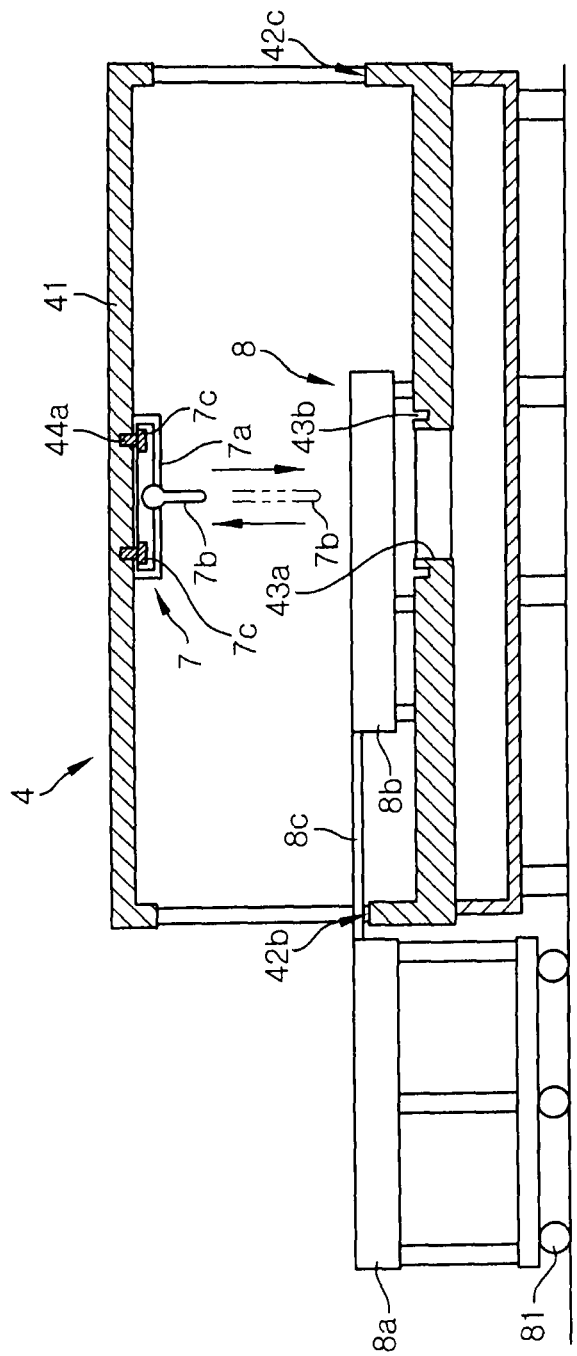

In addition, as shown in FIG. 4B, a lifting mechanism 7 is installed at the lifting mechanism installation portion 44. The lifting mechanism 7 of this example includes: a rail member 7a fixed to the holes 44a with bolts 7c and extended in a horizontal direction; and a chain block 7b fitted to the rail member 7a so as to be movable thereon. Then, a rail member 8 on which a moving carriage moves is inserted from an outside of the common transfer chamber 4 into an inside thereof. In this example, the rail member 8 is inserted into the common transfer chamber 4 via the opening 42b.

Figure 5:
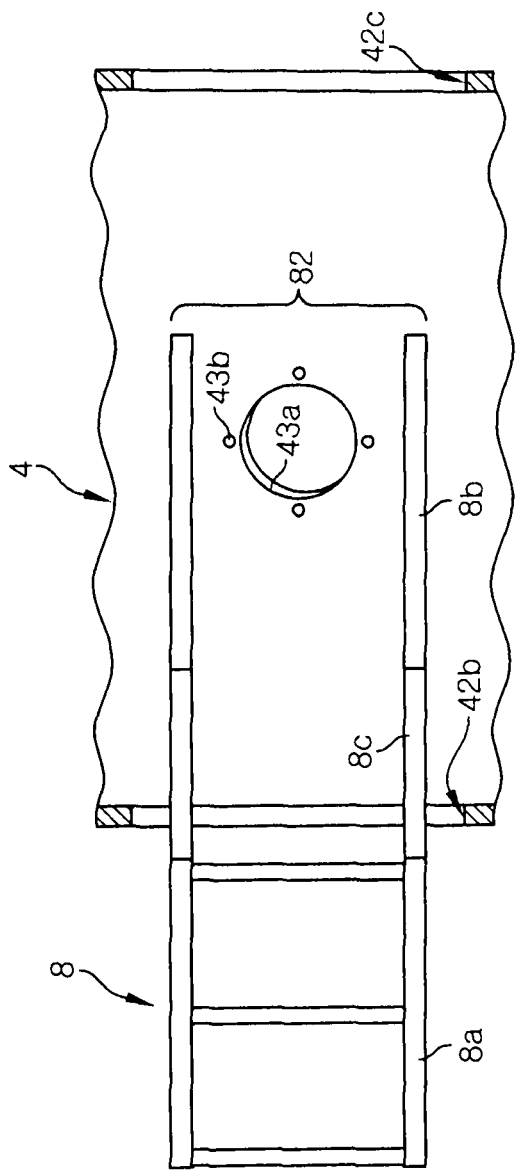
FIG. 5 is a top view of a rail member.

In this example, the rail member 8 includes three members, i.e., a unit mounting portion 8a, provided outside the common transfer chamber 4, for mounting thereon units of the transfer mechanism; a unit support portion 8b provided inside the common transfer chamber 4; and a connecting portion 8c connecting between the unit mounting portion 8a and the unit support portion 8b via the opening 42b. The unit mounting portion 8a of this example has casters 81 attached to a bottom portion thereof and thus can serves as a carriage moving on a floor of the clean room. For example, the unit mounting portion 8a can move while mounting thereon the unit. FIG. 5 shows a top view of the rail member 8 of this example.

Figure 6:
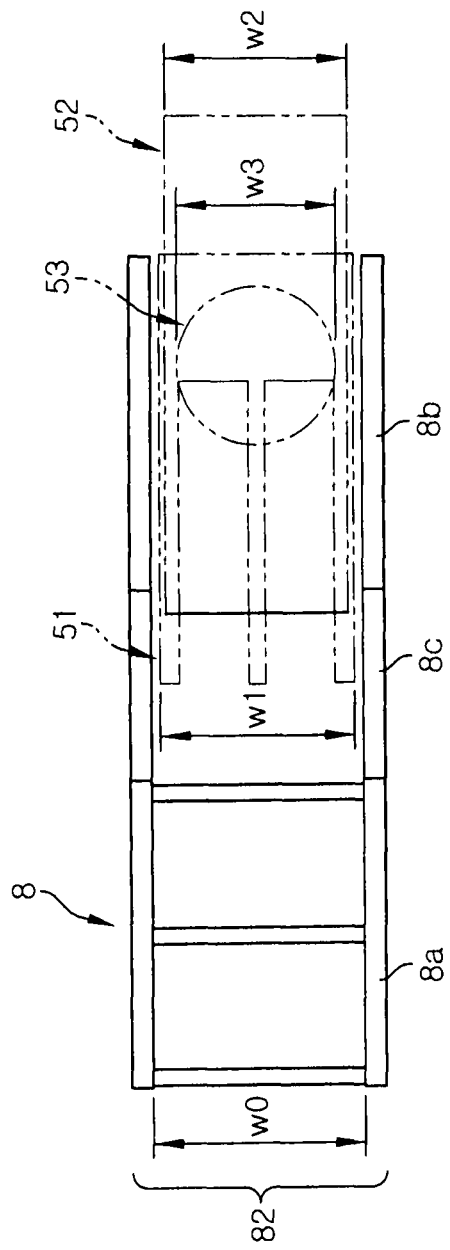
FIG. 6 illustrates a top view of the rail member.

As depicted in FIG. 5, the rail member 8 of this example has a pair of rails 82. The pair of rails 82 are arranged so as to allow the drive unit attachment portion 43 to be disposed therebetween. In this example, as can be seen from FIG. 6, a width W0 between the pair of rails 82 is greater than a width W1 of the pick unit 51, a width W2 of the slide unit 52 and a width W3 of the drive unit 53. This enables fitting of the drive unit 53 to the drive unit installation portion 43 via a gap between the pair of rails 82 and installation of the slide unit 52 to a slide unit installation portion 53a (see FIG. 4G) provided at the drive unit 53 and attachment of the pick unit 51 to the slide base 52a.

Figure 4C:
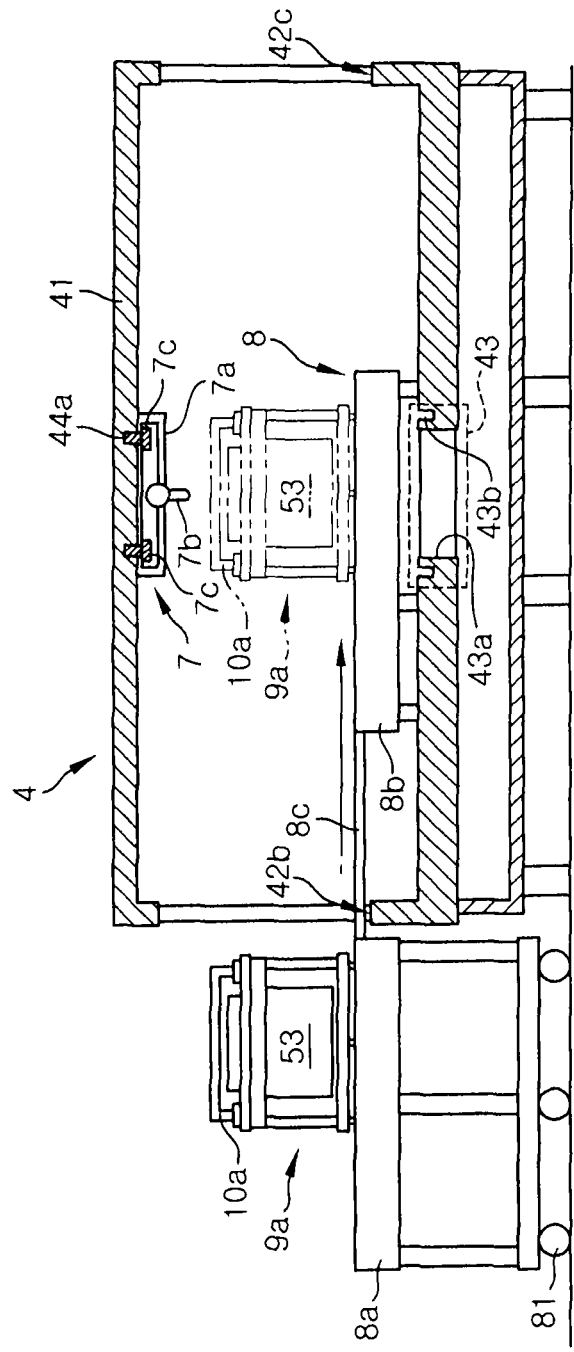

Next, as illustrated in FIG. 4C, a drive unit moving carriage 9a is mounted on the rail member 8, i.e., the unit mounting portion 8a in this example. Then, the drive unit is mounted on the drive unit moving carriage 9a. Thereafter, the drive unit moving carriage 9a moves along the rail member 8 until the drive unit 53 reaches a position right above the drive unit installation portion 43 in the common transfer chamber 4. In this example, a lifting jig 10a for lifting the drive unit 53 is provided on a top of the drive unit 53. The lifting jig 10a may be attached to positioning holes formed at the drive unit 53 with bolts, for example.

Figure 4D:
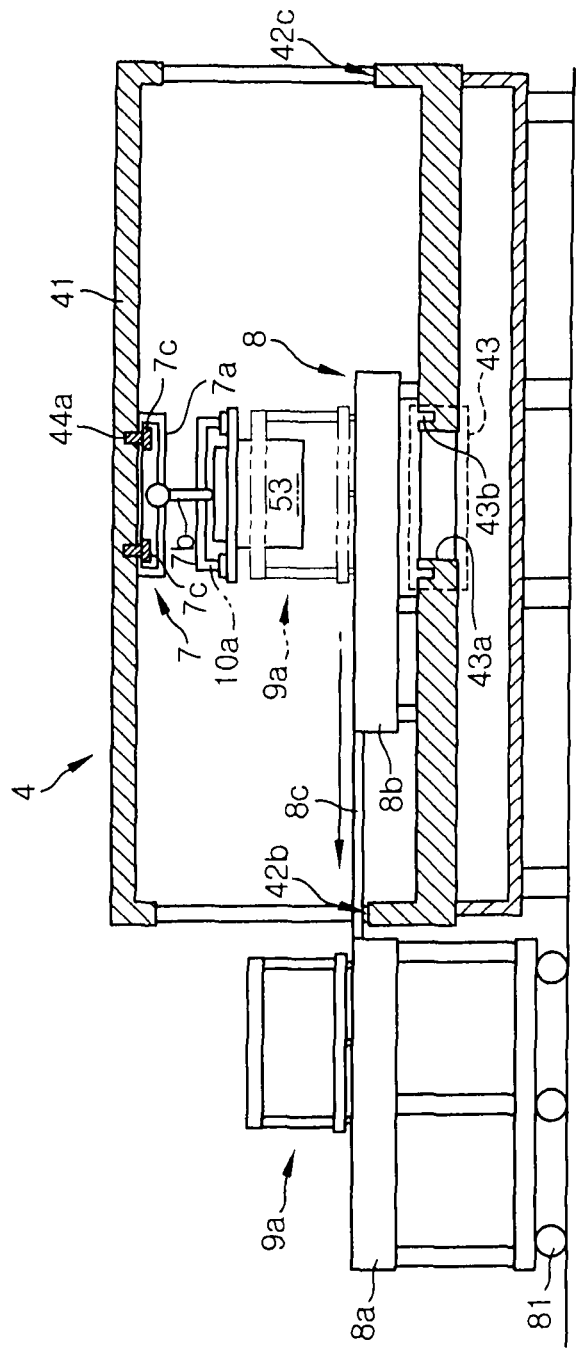

Moreover, as can be seen from FIG. 4D, the lifting jig 10a attached to the drive unit 53 is lifted by using the lifting mechanism 7 such that the drive unit 53 is separated from the drive unit moving carriage 9a. Then, the drive unit moving carriage 9a is withdrawn from the position above the drive unit attachment portion 43.

Figure 4E:
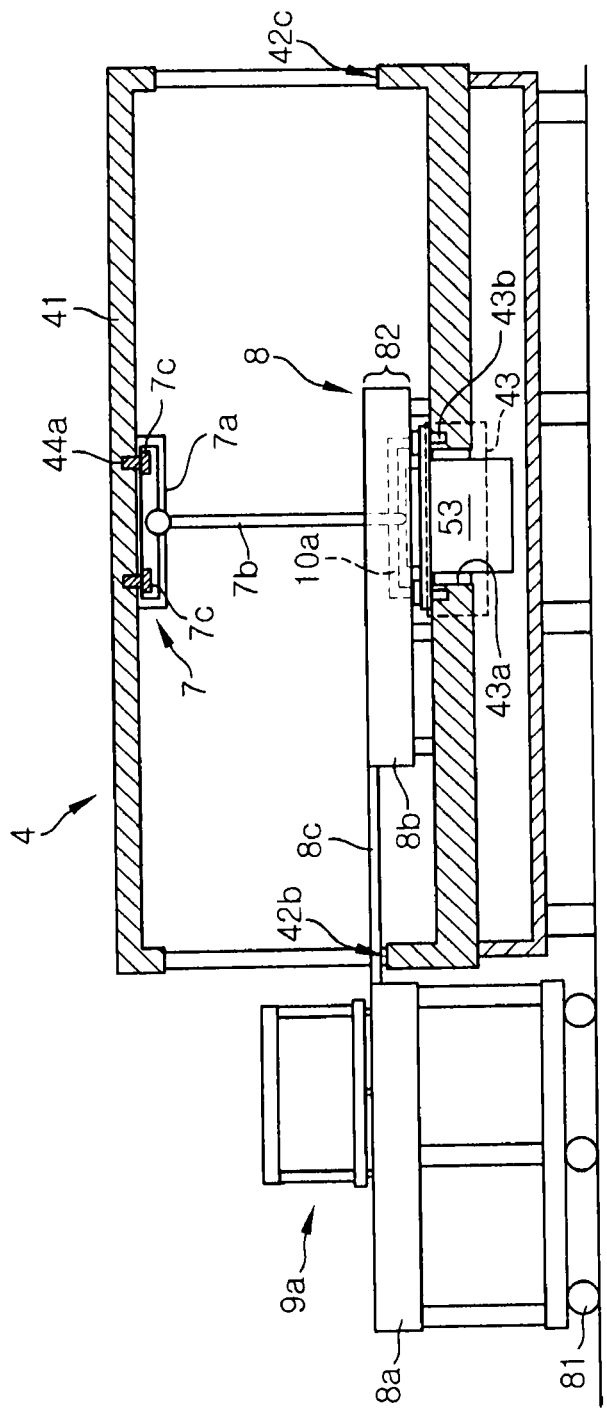

In addition, as depicted in FIG. 4E, the drive unit 63 is lowered to the drive unit installation portion 43 through between the pair of rails 82 by using the lifting mechanism 7.

Figure 4F:
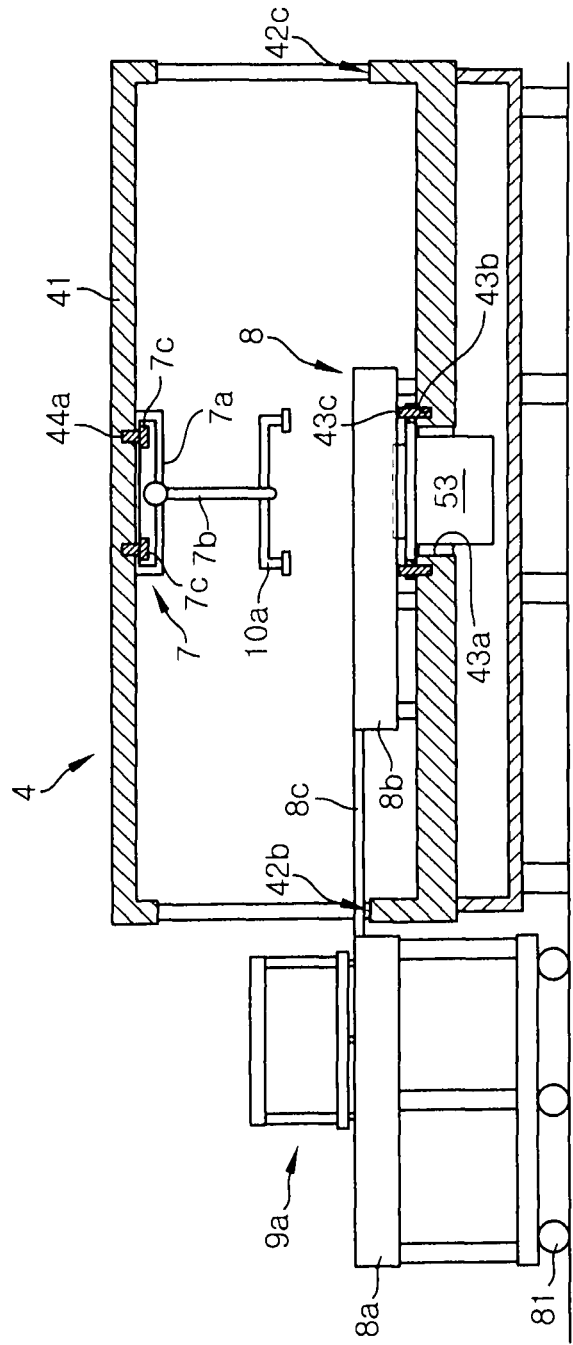

Next, as shown in FIG. 4F, the lifting jig 10a is separated from the drive unit 53 and lifted by the lifting mechanism 7. Thereafter, the drive unit 53 is fixed to the holes 43b of the drive unit installation portion 43 with, e.g., bolts 43c.

Figure 4G:
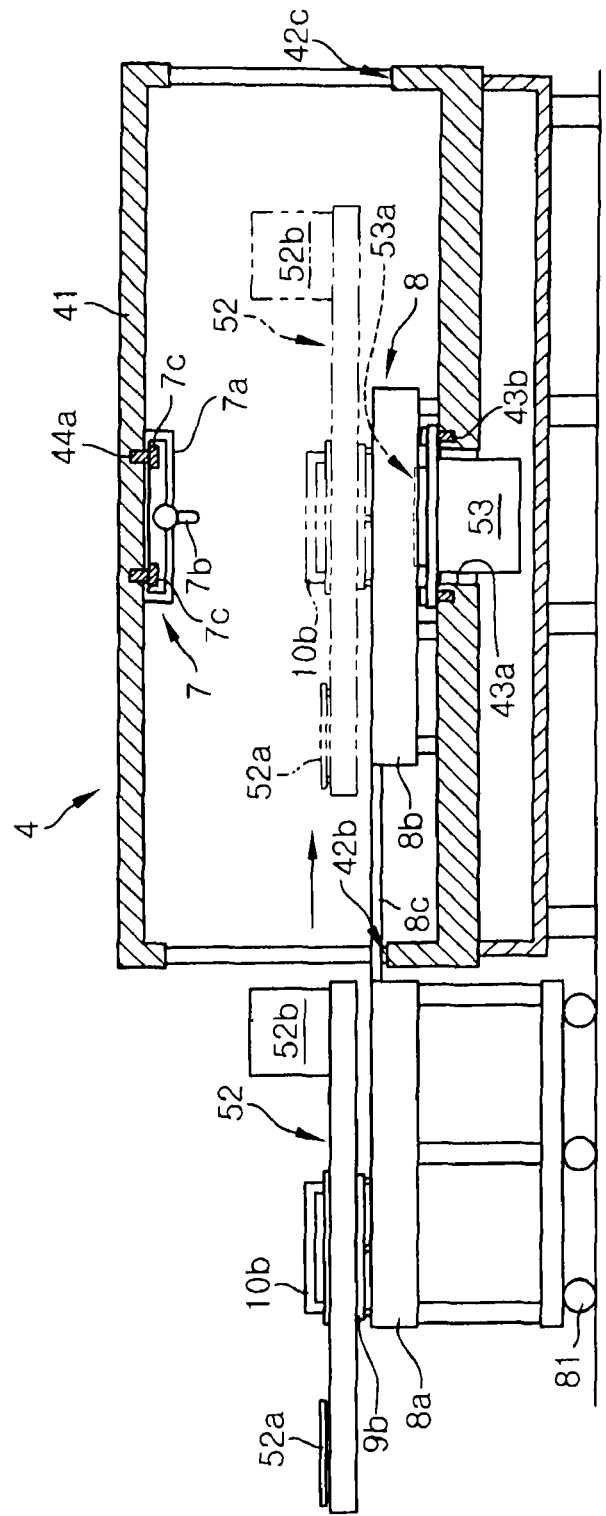

After the drive unit moving carriage 9a is removed from the rail member 8, i.e., the unit mounting portion 8a, as illustrated in FIG. 4G, the slide unit moving carriage 9b is mounted on the unit mounting portion 8a. Then, the slide unit 52 is loaded on the slide unit moving carriage 9b. Thereafter, the slide unit moving carriage 9b moves along the rail member 8, and, accordingly, the slide unit 52 moves to a position right above the slide unit installation portion 53a provided at the drive unit 53. In this example, a lifting jig 10b for lifting the slide unit 52 is provided on the slide unit 52. The lifting jig 10b is preferably attached to the drive unit 53 by using, e.g. bolts.

Figure 4H:
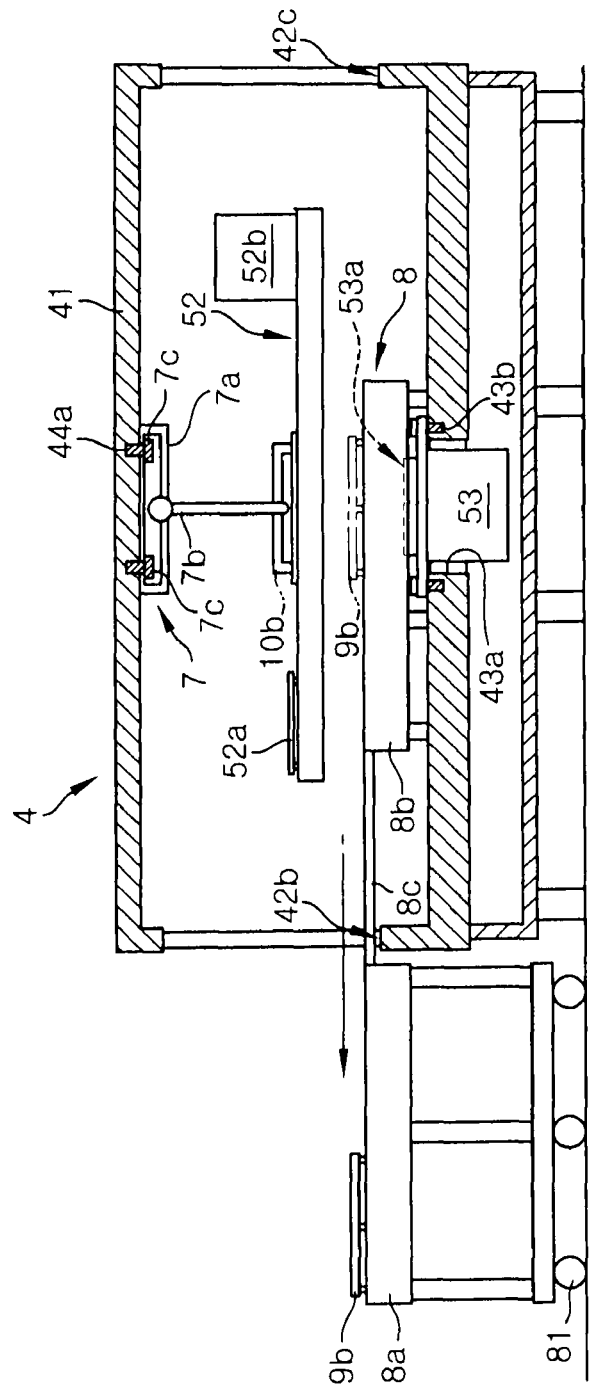

Then, as shown in FIG. 4H, the slide unit 52 is lifted by raising the lifting jig 10b by using the lifting mechanism 7, and, accordingly, is separated from the slide unit moving carriage 9b. Thereafter, the slide unit moving carriage 9b retreats from the position above the slide unit installation portion 53a.

Figure 4I:
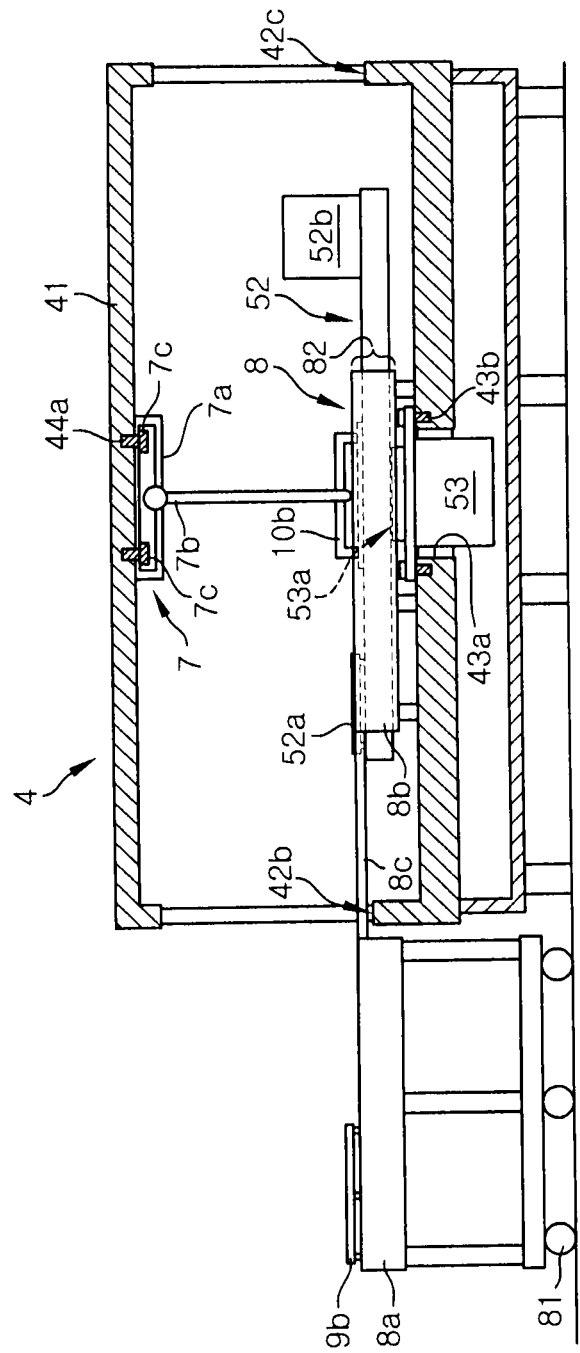

Next, as can be seen from FIG. 4I, the slide unit 52 is lowered to the slide unit installation portion 53a through between the pair of rails 82 by using the lifting mechanism 7.

Figure 4J:
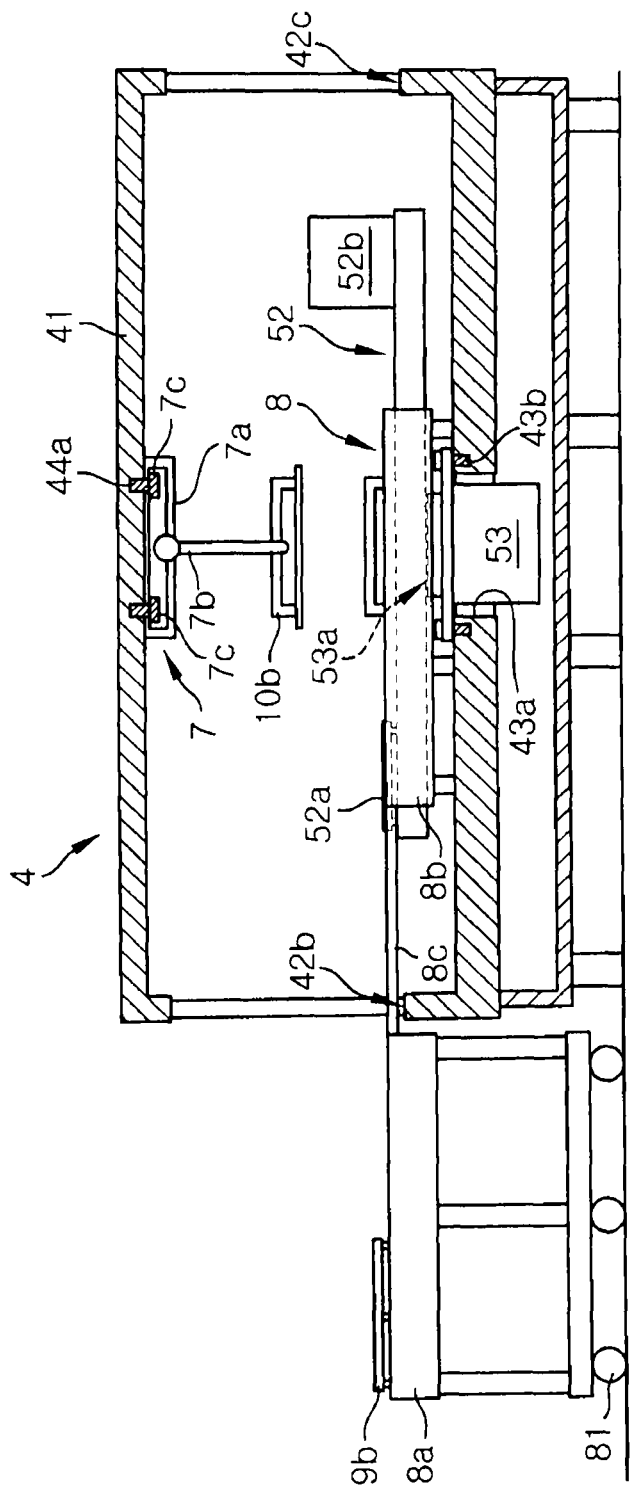

Then, as shown in FIG. 4J, the lifting jig 10b is separated from the slide unit 52 and lifted by the lifting mechanism 7. Thereafter, the slide unit 52 is installed in the slide unit installation portion 53a.

Figure 4K:
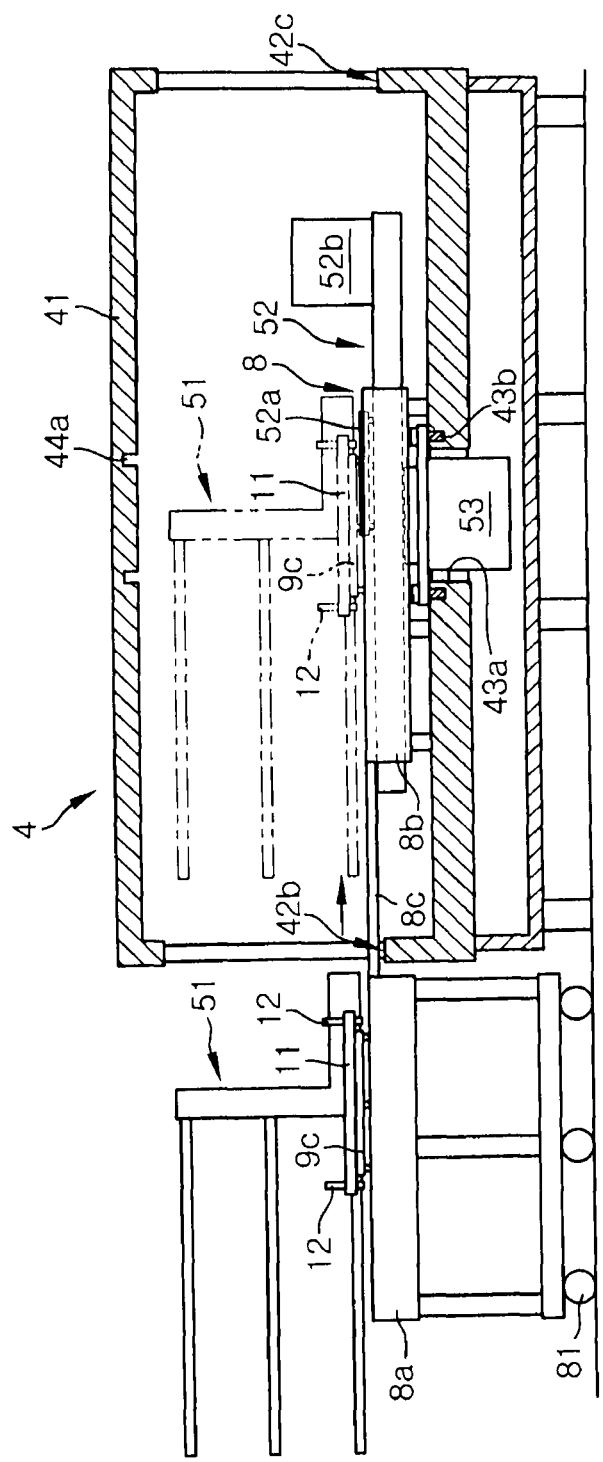

Next, as described in FIG. 4K, the lifting mechanism 7 is removed from the lifting mechanism installation portion 44 provided at the ceiling portion of the common transfer chamber 4. Further, after the slide unit moving carriage 9b is removed from the rail member 8, i.e., the unit mounting portion 8a, the pick unit moving carriage 9c is loaded on the unit mounting portion 8a. Thereafter, jack bolts 12 for jacking up the pick unit 51 are provided at the pick unit 51. In this example, a jack up jig 11 is attached to the pick unit 51, and the jack bolts 12 are attached through the jack up jig 11 to the pick unit 51.

The jack up jig 11 is preferably attached to the pick unit 51 by using, e.g., bolts. Then, the pick unit 51 to which the jack up jig 11 is attached is loaded on the pick unit moving carriage 9c. In this example, by mounting the jack up jig 11 attached to the pick unit 51 on the pick unit moving carriage 9c, the pick unit 51 is loaded on the pick unit moving carriage 9c. Next, the pick unit moving carriage 9c moves along the rail member 8, and the pick unit 51 moves to a position above the slide base 52a provided at the slide unit 52.

Figure 4L:
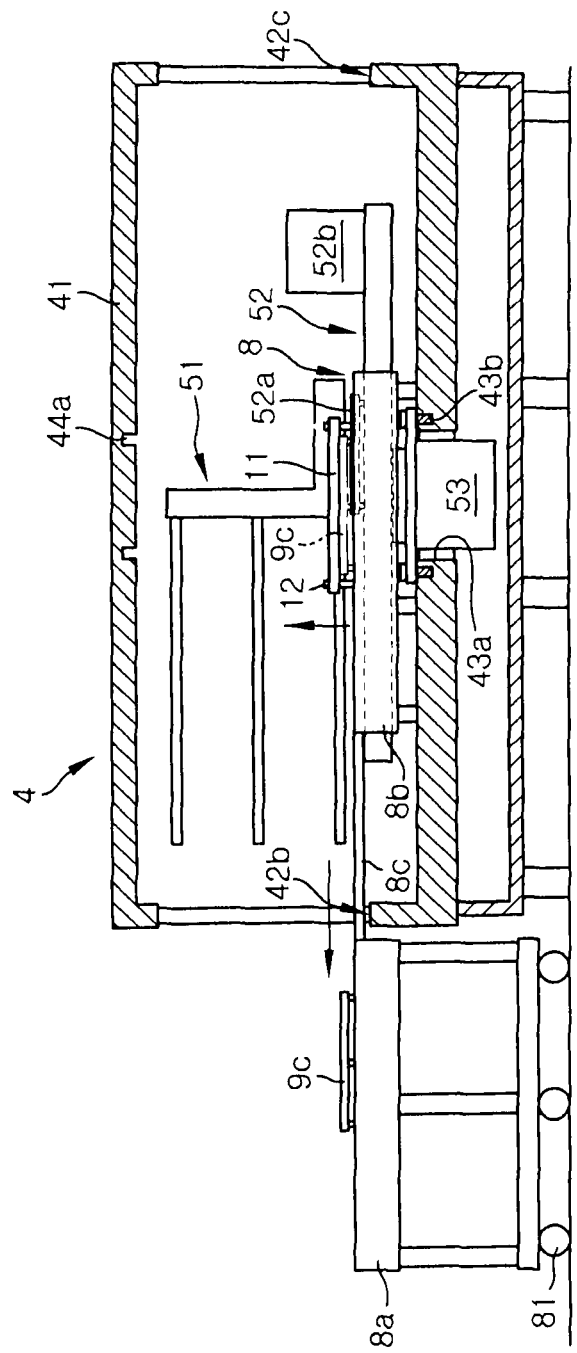

Then, as illustrated in FIG. 4L, by jacking up the jack up jig 11 attached to the pick unit 51 by using the jack bolts 12, the jack up jig 11 is separated from the pick unit moving carriage 9c. Thereafter, the pick unit moving carriage 9c retreats from the position above the slide base 52a.

Figure 4M:
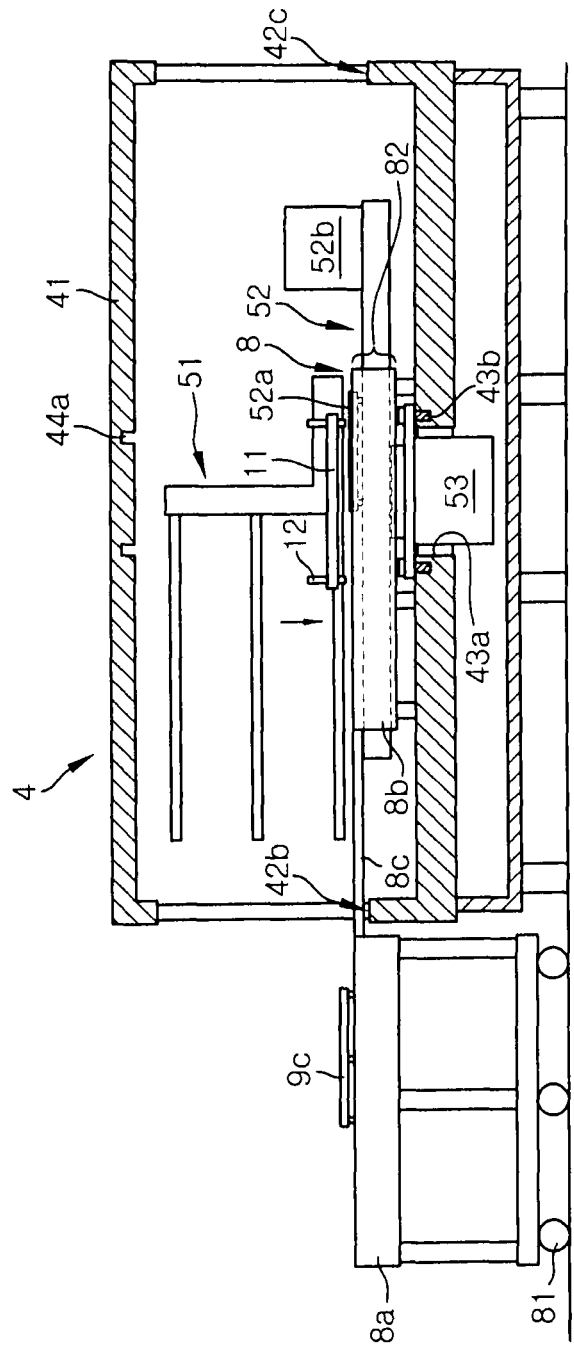
Figure 40:
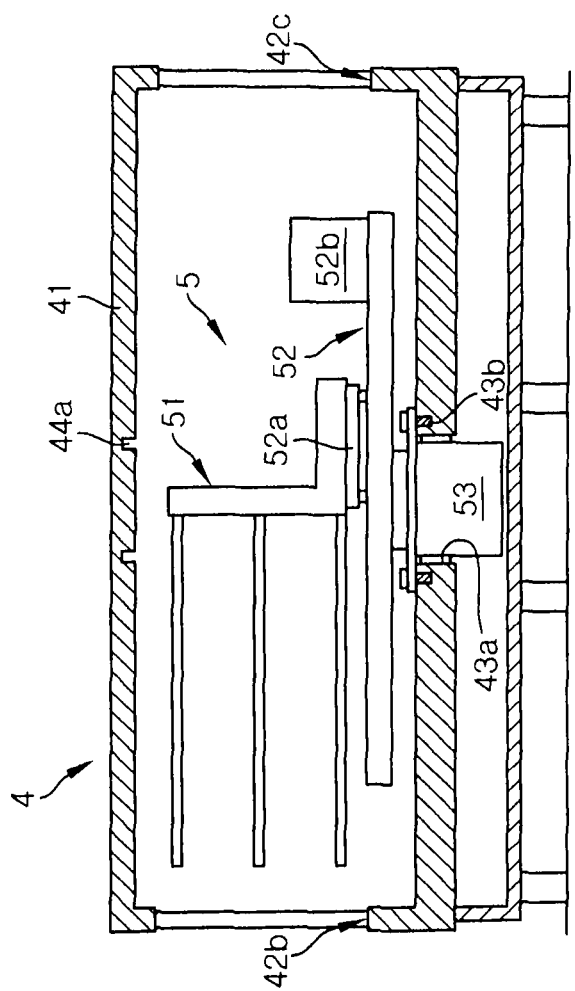

Next, as shown in FIG. 4M, the pick unit 51 is lowered to the slide base 52a between the pair of rails 82 by using the jack bolts 12. Then, the pick unit 51 is installed to the slide base 52a.

Thereafter, as depicted in FIG. 4N, the jack up jig 11 is removed from the pick unit 51. Next, the pick unit moving carriage 9c is removed from the rail member 8, i.e., the unit mounting portion 8a.

Finally, as can be seen from FIG. 4O, the rail member 8 is removed. Hence, the assembly operation of the transfer mechanism 5 is completed, and the transfer mechanism 5 is installed in the common transfer chamber 4.

In the above-described assembly method of the transfer mechanism, the lifting mechanism 7 and the jack up jig 11 serving as moving mechanisms are respectively attached to the inside of the common transfer chamber 4 where the transfer mechanism 5 is accommodated and units of the transfer mechanism 5 which include the pick unit 51, the slide unit 52 and the drive unit 53. With such configuration, the units can be assembled inside the common transfer chamber 4 by using the moving mechanisms. Accordingly, it is possible to obtain the assembly method capable of assembling the transfer mechanism 5 even in a factory where no crane mechanism is installed.

Although the embodiment of the present invention has been described, the present invention is not limited to the above-described embodiment and can be modified without departing from the scope of the invention. Further, the above-described embodiment is not the only embodiment of the present invention.

For example, in the above-described embodiment, both of the lifting mechanism 7 attached to the inside of the common transfer chamber 4 and the jack up jig 11 attached to the pick unit 51 are used as the unit moving mechanisms. However, the transfer mechanism 5 can be assembled inside the common transfer chamber 4 by using only either the lifting mechanism 7 attached to the inside of the common transfer chamber 4 or the jack up jig 11 attached to the pick unit.

However, when the pick unit 51 has the holding members 51a to 51c arranged in multiple levels in a height direction thereof as in the above-described embodiment, a distance between the ceiling portion of the common transfer chamber 4 and an uppermost level of the pick unit 51 decreases, which hinders the lifting operation of the lifting mechanism 7. In that case, as in the above-described embodiment, it is preferable to attach the jack up jig 11 to the pick unit 51 and vertically move the pick unit 51 by using the jack up jig 11.

Moreover, in the above-described embodiment, the rail member 8 is inserted from the outside of the common transfer chamber 4 into the inside thereof via the opening 42*a* which is formed at the common transfer chamber for loading and unloading a target G.

However, when the common transfer chamber 4 has a side plate that can be opened or detached for maintenance, for example, the rail member 8 may be inserted from the outside of the common transfer chamber 4 into the inside thereof via a space formed by opening the side plate or a space formed by detaching the side plate.

In addition, when the common transfer chamber 4 is large-sized and divided into a plurality of blocks, for example, the rail member 8 may be inserted from the outside of the common transfer chamber 4 into the inside thereof via an opening formed before coupling the blocks.

For example, the rail member 8 may be inserted from the outside of the common transfer chamber 4 into the inside thereof via any space that can allow the rail member 8 to be inserted.

Besides, the unit moving carriage of the above embodiment includes the drive unit moving carriage 9*a*, the slide unit moving carriage 9*b* and the pick unit moving carriage 9*c*. However, a common unit moving carriage may be used for the respective units.

Further, in the above embodiment, the slide unit 52 and the pick unit 51 are separately loaded into the common transfer chamber 4 and, then, the pick unit 51 is attached to the slide base 52 inside the common transfer chamber 4.

However, it is also possible to load the slide unit 52 where the pick unit 51 is attached in advance on the slide base 52*a* into the common transfer chamber 4 and then install the slide unit 52 to the slide unit installation portion 53*a*.

Moreover, although the lifting mechanism 7 of the above embodiment includes the chain block 7*b*, it may include a hoist, a winch or a crane.

In the above-described embodiment, there is exemplified a glass substrate used in manufacturing a solar battery or an FPD as a target G. However, the target is not limited to the glass substrate and may be another substrate such as a semiconductor wafer or the like.

While the invention has been shown and described with respect to the embodiments, it will be understood by those skilled in the art that various changes and modification may be made without departing from the scope of the invention as defined in the following claims.

What is claimed is:

1. An assembly method of a transfer mechanism which transfers a target, the assembly method comprising:
    installing a lifting mechanism configured to lift units of the transfer mechanism at a ceiling of a transfer chamber where the transfer mechanism is accommodated, the units including a pick unit configured to hold the target, a slide unit configured to slide the pick unit and a drive unit configured to drive the slide unit and installed at a drive unit installation portion provided in a bottom of the transfer chamber; and
    assembling the units loaded into the transfer chamber inside the transfer chamber by using the lifting mechanism,
    wherein the lifting mechanism is installed at a lifting mechanism installation portion provided in the ceiling corresponding to the drive unit installation portion.

2. The assembly method of claim 1, wherein the units are loaded into the transfer chamber by using a rail member inserted from an outside of the transfer chamber into an inside of the transfer chamber and a moving carriage that moves along the rail member.

3. A transfer chamber comprising therein:
    a transfer mechanism which transfers a target and includes a pick unit configured to hold the target, a slide unit configured to slide the pick unit and a drive unit configured to drive the slide unit and installed at a drive unit installation portion provided in a bottom of the transfer chamber; and
    a lifting mechanism configured to assemble the pick unit, the slide unit and the drive unit and detachably installed at an lifting mechanism installation portion provided in a ceiling of the transfer chamber corresponding to the drive unit installation portion.

4. An assembly method of a transfer mechanism which transfers one or more targets and includes a pick unit for holding the targets, a slide unit for sliding the pick unit and a drive unit for driving the slide unit, the assembly method comprising:
    installing a lifting mechanism for lifting the units at a ceiling portion of a transfer chamber where the transfer mechanism is accommodated;
    inserting a rail member on which a moving carriage moves, from an outside of the transfer chamber into an inside of the transfer chamber;
    mounting the drive unit on the moving carriage;
    moving the moving carriage on which the drive unit is mounted to a position above a drive unit installation portion in the transfer chamber;
    lifting the drive unit by using the lifting mechanism and separating the drive unit from the moving carriage;
    retreating the moving carriage from the drive unit installation portion, lowering the drive unit to the drive unit installation portion, and installing the drive unit to the drive unit installation portion;
    mounting the slide unit on the moving carriage;
    moving the moving carriage on which the slide unit is mounted to a position above a slide unit installation portion of the drive unit;
    lifting the slide unit by using the lifting mechanism and separating the slide unit from the moving carriage;
    retreating the moving carriage from the slide unit installation portion, lowering the slide unit to the slide unit installation portion, and installing the slide unit at the slide unit installation portion;
    removing the lifting mechanism from the ceiling portion of the transfer chamber;
    providing the pick unit with jack bolts for jacking up the pick unit;
    mounting on the moving carriage the pick unit to which the jack bolts are provided;
    moving the moving carriage to a position above a slide base provided at the slide unit;
    jacking up the pick unit by using the jack bolts and separating the pick unit from the moving carriage;
    retreating the moving carriage from the slide base, lowering the pick unit to the slide base, and installing the pick unit on the slide base;
    removing the jack bolts from the pick unit; and
    removing the rail member.

5. The assembly method of claim 4, wherein the rail member is inserted from the outside of the common transfer chamber into the inside of the common transfer chamber via a transfer port which is formed at the transfer chamber for transfer of the target.

6. The assembly method of claim 4, wherein the transfer chamber has an openable or detachable side plate, and the rail member is inserted from the outside of the transfer chamber into the inside of the transfer chamber via a space formed by opening the side plate or a space formed by detaching the side plate.

7. The assembly method of claim 4, wherein the transfer chamber is divided into blocks, and the rail member is inserted from the outside of the transfer chamber into the inside of the transfer chamber via an opening formed before coupling the blocks.

8. The assembly method of claim 4, wherein the rail member has a pair of rails and is inserted from the outside of the transfer chamber into the inside of the transfer chamber such that the drive unit installation portion is disposed between the pair of rails.

9. The assembly method of claim 4, wherein the pick unit has holding members which are arranged in multiple levels in a height direction to hold the respective targets.

\* \* \* \* \*